(12) United States Patent
Tailliet

(10) Patent No.: US 7,714,622 B2
(45) Date of Patent: May 11, 2010

(54) INTEGRATED CIRCUIT INPUT STAGE

(75) Inventor: Francois Tailliet, Fuveau (FR)

(73) Assignee: STMicroelectronics SA, Montrouge (FR)

( * ) Notice: Subject to any disclaimer, the term of this patent is extended or adjusted under 35 U.S.C. 154(b) by 51 days.

(21) Appl. No.: 11/624,135

(22) Filed: Jan. 17, 2007

(65) Prior Publication Data
US 2007/0164795 A1 Jul. 19, 2007

(30) Foreign Application Priority Data
Jan. 18, 2006 (FR) .................................. 06 00421

(51) Int. Cl.
H03K 5/153 (2006.01)
(52) U.S. Cl. ..................... 327/73; 327/54; 327/675; 327/67; 327/72
(58) Field of Classification Search ................. 327/205, 327/206, 72, 73, 87, 52, 53, 58, 60, 62, 63, 327/65–69, 71, 74, 77–81, 88, 89, 96, 127, 327/246, 266, 274, 280, 287, 359, 560–563
See application file for complete search history.

(56) References Cited
U.S. PATENT DOCUMENTS

| 5,214,328 | A | 5/1993 | Ohi |
| 5,268,872 | A | 12/1993 | Fujii et al. |
| 5,548,227 | A | 8/1996 | Minami |
| 5,798,663 | A * | 8/1998 | Fugere et al. ............... 327/205 |
| 6,249,162 | B1 | 6/2001 | Inoue |
| 6,249,556 | B1 | 6/2001 | Rees et al. |
| 6,339,352 | B1 * | 1/2002 | Cosan et al. ................. 327/205 |
| 6,359,485 | B1 * | 3/2002 | Drapkin et al. ............. 327/206 |
| 6,617,890 | B1 * | 9/2003 | Chen et al. .................... 327/78 |
| 2004/0085098 | A1 * | 5/2004 | Kajimoto ..................... 327/78 |

* cited by examiner

Primary Examiner—Lincoln Donovan
Assistant Examiner—Brandon S Cole
(74) Attorney, Agent, or Firm—Lisa K. Jorgenson; Eric M. Ringer; Seed IP Law Group

(57) ABSTRACT

An input stage of an integrated circuit, includes a comparator for comparing the voltage of an input signal of the input stage with a reference voltage, and supplying a binary output signal the value of which depends on the result of the comparison of the input signal with the reference voltage. The input stage comprises a feedback circuit measuring a parameter representative of the operation of the comparator, and raising the reference voltage while the measured parameter reveals a faulty operation of the comparator.

32 Claims, 4 Drawing Sheets

INTEGRATED CIRCUIT INPUT STAGE

BACKGROUND OF THE INVENTION

1. Field of the Invention

The present invention relates to integrated circuits and more particularly the input stages of CMOS logic integrated circuits supplying a logic signal according to an analog input signal.

2. Description of the Related Art

Generally speaking, the input stages of integrated circuits have inputs having a switch level centered around half of the supply voltage. This condition is easily obtained for example using the input stage represented in FIG. 1. In FIG. 1, the input stage INST1 comprises a balanced inverter comprising a PMOS transistor MP1 and an NMOS transistor MN1. The gate of the transistors MP1 and MN1 is connected to the input Vin of the circuit. The drains of the transistors MN1 and MP1 are connected to the output Vout of the circuit. The source of the transistor MP1 receives the supply voltage Vdd. The source of the transistor MN1 is connected to the ground.

The transistors MN1 and MP1 have similar threshold voltages in absolute value. When the transistors MN1 and MP1 have the same geometric dimensions, the transistor MN1 has a conductance two to three times greater than the conductance of the transistor MP1. This property is due to the mobility of the electrons that is two to three times greater that the mobility of the holes. If the width-to-length ratio W/L of the transistor MP1 is two or three times greater than the ratio of the transistor MN1, the two transistors then have the same conductance if they further receive the same substrate-gate voltage in absolute value. Due to its symmetry, the input stage INST1 has a switch threshold voltage equal to half of the supply voltage (Vdd/2). Depending on whether the input voltage Vin is greater or lower than the switch threshold voltage, the voltage of the output signal Vout is equal to 0 or Vdd.

Certain applications require a switch threshold that is not equal to Vdd/2, but to another fraction of the supply voltage Vdd, or to a fixed voltage not linked to the voltage Vdd. In addition, the threshold voltages of the n- and p-channel MOS transistors can be different in absolute value. In certain applications, the input stages must be able to operate at low voltage, close to the threshold voltages of the transistors of the integrated circuit.

In such situations, a voltage comparator comparing the voltage applied at input with a reference voltage is generally used. Typically, such a comparator is produced using a differential amplifier. An example of an input stage comprising a differential amplifier is represented in FIG. 2. The input stage INST2 represented in FIG. 2 comprises a current mirror differential amplifier DAMP comprising an input receiving the input voltage Vin and an output O1 connected to the output Vout of the input stage INST2 through three cascade-arranged inverters I1, I2, I3.

Classically, the amplifier DAMP comprises an input branch receiving the input voltage Vin and a reference branch receiving a reference voltage Vref1. The input branch comprises a p-channel MOS transistor MP2 the source of which receives the supply voltage Vdd and the drain of which is connected to the drain of an n-channel MOS transistor MN2. The gate of the transistor MN2 receives the input voltage Vin. The reference branch comprises a p-channel MOS transistor MP3 the source of which receives the supply voltage Vdd and the drain of which is connected to the drain of an n-channel MOS transistor MN3. The gate of the transistor MP2 is connected to the gate and to the drain of the transistor MP3.

The sources of the transistors MN2 and MN3 are connected to the drain of an n-channel MOS transistor MN4 the source of which is connected to the ground. A reference voltage VrefN is applied to the gate of the transistor MN4, such that the saturation current of the transistor MN4 is equal to a reference current IrefN. IrefN therefore represents the maximal current likely to pass through the transistor MN4. The output O1 of the amplifier DAMP is connected to the drains of the transistors MP2 and MN2.

If the voltage Vin is greater than the voltage Vref1, the voltage at the output O1 decreases by tending towards the voltage GND1 of the drain of the transistor MN4. Conversely, if the voltage Vin is lower than the voltage Vref1, then the voltage is equal to the supply voltage Vdd. The output O1 supplies a signal biased under a low current. The inverter I1 is produced with transistors designed to be able to switch rapidly despite a low current available at the output O1. The W/L ratios of the transistors of the inverters I1, I2 and I3 have increasing values from I1 to I3, to shape the signal coming from the output O1 and to supply a logic signal at the output Vout.

The amplifier DAMP imposes certain limitations on the value of the reference voltage Vref1. Indeed, the amplifier DAMP only operates in the presence of a sufficient positive current i in the reference branch (comprising the transistors MP3 and MN3). The transistor MN3 must therefore allow a minimum current to pass. For this purpose, the voltage Vref1 must be greater than the threshold voltage Vtn of the transistor MN3. To reduce the effect of the constraint imposed by this condition, native n-channel transistors are preferably used that have a lower threshold voltage Vtn.

In addition, if the voltage Vref1 is lower than the threshold voltage Vtn of the transistor MN3, the input stage does not operate at all. The output voltage Vout can then vary randomly, which can be a dangerous operating condition for the integrated circuit equipped with the input stage. As a result, to maintain the amplifier DAMP in a fully operational state, in given temperature and supply voltage conditions, and for a given manufacturing chain, the voltage Vref1 must be sufficiently greater than the threshold voltage Vtn of the transistor MN3. This condition proves to be all the more restrictive as the variations in the voltage Vtn can be totally decorrelated from the variations in the voltage Vref1.

Typically, the transistor MN3 has for example a threshold voltage Vtn at ambient temperature of 450 mV, this voltage possibly varying by +/−100 mV according to the manufacturing conditions. The temperature coefficient, i.e., the variation rate of the threshold voltage according to the temperature is equal to approximately −2 mV/° C. The result is that, in a recommended temperature variation range from −40 to +85° C., the threshold voltage of the transistor MN3 can vary from 230 to 680 mV. To guarantee the operation of the amplifier DAMP, the voltage Vref1 must be greater than 700 mV when the threshold voltage Vtn of the transistor MN3 reaches 680 mV. If the voltage Vref1 has its own variation range, it can reach 1 volt.

Furthermore, the current passing through each of the input and reference branches must be low to limit the current consumption of the circuit.

BRIEF SUMMARY OF THE INVENTION

An embodiment of the present invention provides an input stage for integrated circuits that does not have the limitations described above. To this end, one principle of one embodiment is to keep the transistor MN3 on, by adjusting the reference voltage.

Thus, one embodiment includes a circuit that measures the current i in the reference branch (transistors MP3, MN3) of the comparator and that increases the reference voltage so that the current i remains greater than a minimum positive value.

More particularly, one embodiment includes a device comprising a comparator for comparing the voltage of an input signal of the comparator with a reference voltage, and supplying a binary output signal the value of which depends on the result of the comparison of the input signal with the reference voltage.

According to one embodiment, the device comprises a feedback circuit measuring a parameter representative of the operation of the comparator, and raising the reference voltage while the measured parameter reveals a faulty operation of the comparator.

According to one embodiment of the present invention, the comparator comprises an input branch receiving the input signal and a reference branch receiving the reference voltage, the parameter representative of the operation of the comparator being a current passing through the reference branch.

According to one embodiment of the present invention, the comparator does not operate correctly if the current measured is below a positive limit value.

According to one embodiment of the present invention, the feedback circuit comprises a measuring stage supplying a measuring current proportional to the parameter to be measured, a reference voltage source, and means for raising the reference voltage when the measuring current is lower than a minimum current.

According to one embodiment of the present invention, the feedback circuit comprises a resistor for raising the impedance of the reference voltage source and for raising the reference voltage under the effect of a current passing through the resistor and appearing when the current measured is lower than a minimum current.

According to one embodiment of the present invention, the feedback circuit comprises a capacitor for absorbing oscillations appearing in the reference voltage.

According to one embodiment of the present invention, the comparator comprises a first current mirror differential amplifier comprising an input branch receiving the input signal and a reference branch receiving the reference voltage.

According to one embodiment of the present invention, the comparator comprises several inverters cascade-connected to an output of the differential amplifier for putting the output signal of the differential amplifier into the form of a logic signal.

According to one embodiment of the present invention, the comparator comprises a second differential amplifier cascade-connected to an output of the first amplifier, and several inverters cascade-mounted at an output of the second differential amplifier, for putting the output signal of the first differential amplifier into the form of a logic signal.

One embodiment of the present invention also relates to an integrated circuit comprising an input stage, characterized in that the input stage comprises a device as defined above, and an input connected to the input of the comparator.

One embodiment of the present invention also relates to an acquisition method for acquiring an input signal in an integrated circuit, comprising steps of comparing the voltage of an input signal with a reference voltage, and supplying a binary output signal the value of which results from the comparison of the input signal with the reference voltage, characterized in that it comprises steps of measuring a parameter representative of the operation of a comparator having performed the comparison step, and of raising the reference voltage, while the measured parameter reveals a faulty operation of the comparator.

According to one embodiment of the present invention, the parameter representative of the operation of the comparator is a current passing through a reference branch of the comparator.

According to one embodiment of the present invention, the comparator is not operating correctly if the current measured is below a positive limit value.

According to one embodiment of the present invention, the method comprises steps of supplying a measuring current proportional to the parameter to be measured, and of raising the reference voltage when the measuring current is lower than a minimum current.

BRIEF DESCRIPTION OF THE SEVERAL VIEWS OF THE DRAWINGS

These and other features and advantages of the present invention shall be presented in greater detail in the following description of an embodiment of the present invention, given in relation with, but not limited to the following figures, in which.

DETAILED DESCRIPTION OF THE INVENTION

Figure 3:
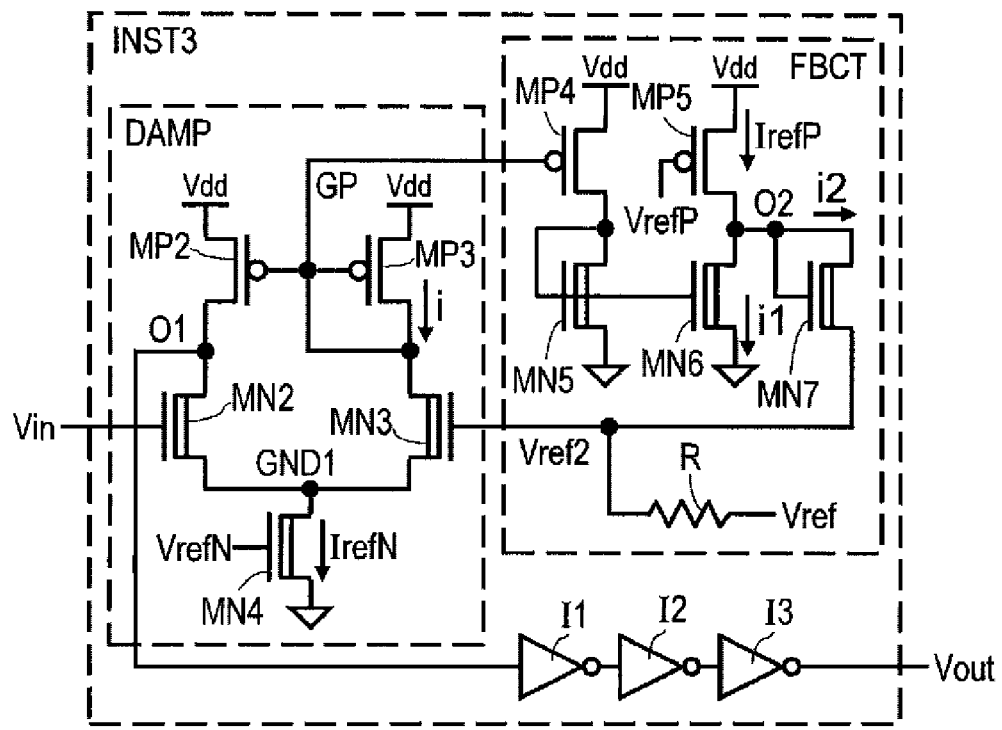
FIG. 3 represents an input stage according to one illustrated embodiment.

FIG. 3 represents an input stage of an integrated circuit according to the present invention. In FIG. 3, the input stage INST3 comprises an input Vin, an output Vout, and a comparator for comparing the voltage applied to the input Vin with a reference voltage Vref2. The comparator comprises a differential amplifier DAMP connected to the input Vin of the input stage, and three cascade-arranged inverters I1, I2, I3 connected between an output O1 of the amplifier DAMP and the output Vout of the input stage INST3. The amplifier comprises an input branch Vin receiving the input voltage and a reference branch receiving the reference voltage Vref2.

According to one embodiment, the input stage INST3 comprises a feedback circuit FBCT that adjusts the reference voltage Vref2 so that the current in the reference branch remains greater than a minimum positive value imin.

Figure 1:
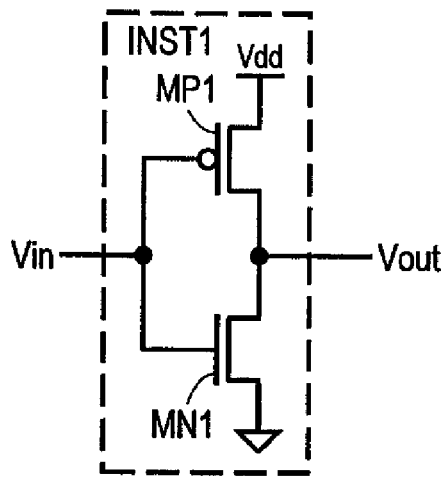
FIG. 1 already described represents an input stage according to previous practices, FIG. 2 already described represents another input stage according to previous practices.
Figure 2:
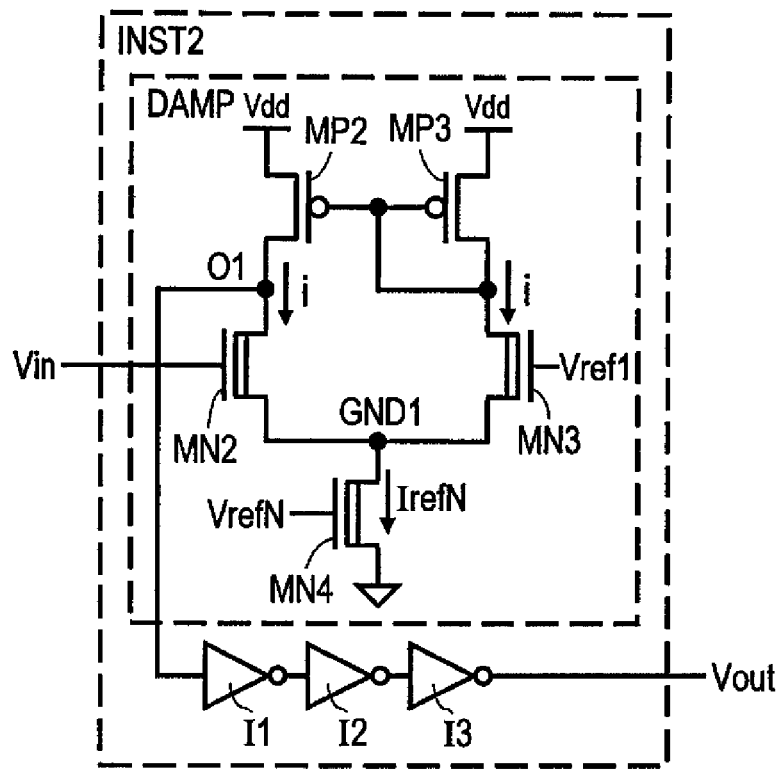

The amplifier DAMP is similar to the amplifier described with reference to FIG. 2. Thus, the amplifier DAMP comprises an input branch receiving the input voltage Vin and a reference branch receiving a reference voltage Vref2. The input branch comprises a p-channel MOS transistor MP2 the source of which receives the supply voltage Vdd and the drain of which is connected to the drain of an n-channel MOS transistor MN2. The gate of the transistor MN2 receives the input voltage Vin. The reference branch comprises a p-channel MOS transistor MP3 the source of which receives the supply voltage Vdd and the drain of which is connected to the drain of an n-channel MOS transistor MN3. The gate of the transistor MP2 that is at a voltage GP, is connected to the gate and to the drain of the transistor MP3.

The sources of the transistors MN2 and MN3 are connected to the drain of an n-channel MOS transistor MN4 the source of which is connected to the ground. A reference voltage VrefN is applied to the gate of the transistor MN4, such that a reference current IrefN circulates in the transistor MN4. The output O1 of the amplifier DAMP is connected to the drains of the transistors MP2 and MN2. The current i circulating in the reference branch is identical to the current circulating in the input branch if the transistors MP2 and MP3 have the same physical properties, and in particular the same channel length and width.

If the voltage Vin is greater than the voltage Vref2, the voltage at the output O1 decreases by tending towards the voltage GND1 of the drain of the transistor MN4. Conversely, if the voltage Vin is lower than the voltage Vref2, then the voltage is equal to the supply voltage Vdd. The output O1 supplies a signal biased under a low current. The inverter I1 is produced with transistors designed to be able to switch rapidly despite a low current available at the output O1. In other words, the transistors of the inverter I1 have low channel width W and length L to capacitively load the output O1 as little as possible, in order to optimize the switch speed of the inverter. The W/L ratios of the transistors of the inverters I1, I2 and I3 have increasing values from I1 to I3, to shape the signal coming from the output O1 and to supply a logic signal at the output Vout.

If the voltage GND1 is too low to be compatible with a classic inverter, the inverter I1 may be made up of to be a differential amplifier, of the amplifier DAMP type for example.

The circuit FBCT comprises p-channel MOS transistors MP4, MP5 the source of which receives the supply voltage Vdd, n-channel MOS transistors MN5, MN6 the source of which is connected to the ground, an n-channel MOS transistor MN7, and a resistor R. The gate of the transistor MP4 receives the voltage GP from the gates of the transistors MP2 and MP3. The gate and the drain of the diode-mounted transistor MN5 are connected to the drain of the transistor MP4. The gate of the transistor MP5 receives a reference voltage VrefP, such that the saturation current of the transistor MP5 is equal to a reference current IrefP. The drain of the transistor MP5 is connected to the drain of the transistor MN6, and to the drain and to the gate of the diode-mounted transistor MN7. The source of the transistor MN7 is connected to the gate of the transistor MN3 and linked to a reference voltage source Vref through the resistor R.

The NMOS transistors of the amplifier DAMP and of the circuit FBCT are preferably native n-channel transistors.

The reference voltage Vref2 that is applied to the gate of the transistor MN3 is substantially equal to the voltage Vref possibly increased by the voltage that appears on the resistor R under the effect of the current i2 that appears on the drain of the transistor MN7.

Figure 4:
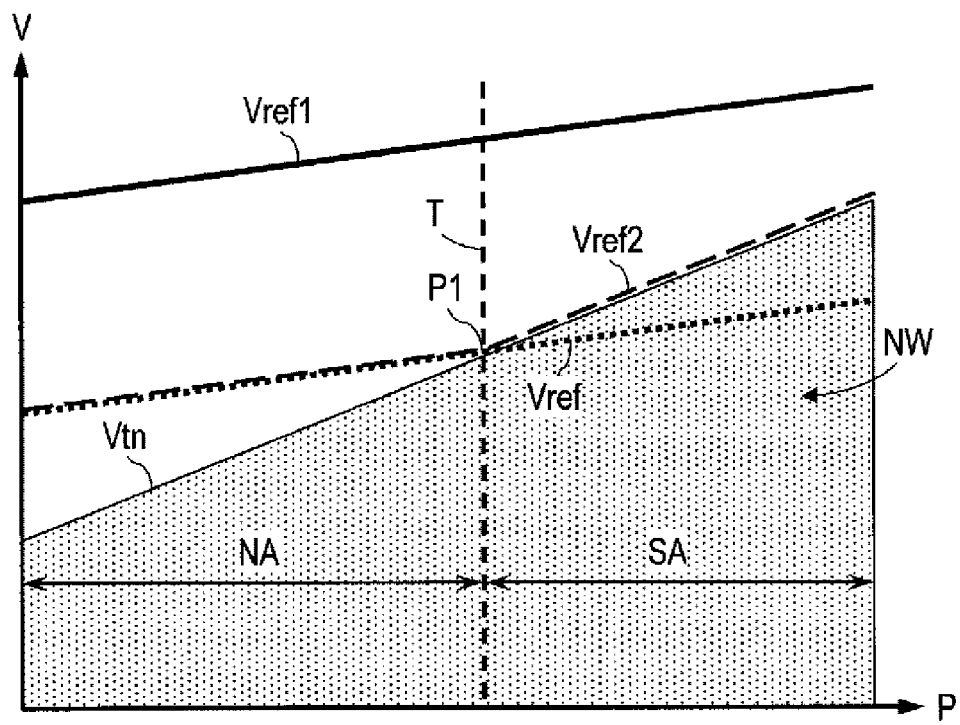
FIG. 4 represents voltage curves showing the operation of the input stage according to the embodiment illustrated in FIG. 3.

The operation of the circuit FBCT according to the embodiment illustrated in FIG. 3 is shown by FIG. 4. FIG. 4 represents in the shape of curves, examples of variations in the reference voltages Vref and Vref2, and in the threshold voltage Vtn, according to a parameter P characterizing the operating environment of the integrated circuit, i.e., particularly operating temperature, supply voltage, or variation in the manufacturing chain. If the reference voltage Vref applied to the amplifier DAMP is situated in an area NW (marked by dotted lines in the figure) below the variation curve of the voltage Vtn, the amplifier DAMP does not operate, as the current i passing through the transistor MN3 is zero. With the input stages of previous practices such as the input stage INST2 shown in FIG. 2, it was therefore necessary to choose a reference voltage Vref1 that was always much greater than the threshold voltage Vtn, so as to have a margin of safety in relation to the variations in the voltages Vref1 and Vtn. On the contrary, in the input stage INST3 according to the present invention, the reference voltage Vref can be chosen at a lower value that can be situated in the area NW.

FIG. 4 also represents a vertical straight line T passing through a point of intersection P1 between the variation curve of the voltage Vtn and the variation curve of the voltage Vref. The straight line T delimits a normal operating area NA on the left-hand side, and a secure operating area SA on the right-hand side of the straight line T.

When the reference voltage Vref is greater than the threshold voltage Vtn of the transistor MN3 (i.e., when the voltage Vref is situated in the area NA), the circuit FBCT does not change this reference voltage (Vref2=Vref). On the other hand, when the reference voltage Vref is insufficient to bias the amplifier (Vref<Vtn) (i.e., when the voltage Vref is situated in the area SA on the right-hand side of the straight line T), the circuit FBCT applies to the gate of the transistor MN3 of the amplifier DAMP a voltage Vref2 equal to the voltage Vref to which the voltage R.i2 (Vref2=Vref+R.i2) is added. The voltage Vref2 is thus fixed at a value greater than the voltage Vtn, so that the current i circulating in the transistor MN3 is greater than the minimum fixed value imin.

In practice, the circuit FBCT measures the current i passing through the transistor MP2 using a current mirror comprising the transistor MP3, and applies a current to the resistor R if the current i measured is lower than a certain value. For this purpose, the current that circulates in the transistor MP3 is copied in the transistor MN5, then in the transistor MN6. The transistor MN5 tends to impose in the transistor MN6 a current i1 proportional to the current i (i1=K.i). The proportionality coefficient K depends on the ratio of the mirror chain formed by the transistors MP3, MP4, MN5 and MN6. More precisely, the ratio K is proportional to the ratio WR= (WMP4/WMP3).(WMN6/WMN5,) in which WMP4, WMP3, WMN5, WMN6 are respectively the channel widths of the transistors MP4, MP3, MN5 and MN6.

If the current i1 in the transistor MN6 is lower than the saturation current IrefP of the transistor MP5, the transistor MP5 draws more current than the transistor MN6. The result is that the voltage increases and therefore that the voltage Vref2 increases too. The transistor MN3 then draws more current, and therefore causes the intensity of the current I to increase. Equilibrium is achieved when i1 (=K.i)=IrefP.

Therefore, the choice of the voltage VrefP enables the value of the minimum positive current i imin, which must circulate in the reference branch and in the input branch, to be adjusted to the equilibrium of the feedback loop:

$$Imin=IrefP/K \qquad (1)$$

This choice is useful because the aim is to find a compromise between the current consumption and the reaction rate of the input circuit. If the input signal has a frequency in the order of a few tens of kHz, the current i must be equal to at least about a hundred nA. If the input signal has a frequency in the order of a few MHz, the current i must be equal to at least a few µA.

Figure 5:
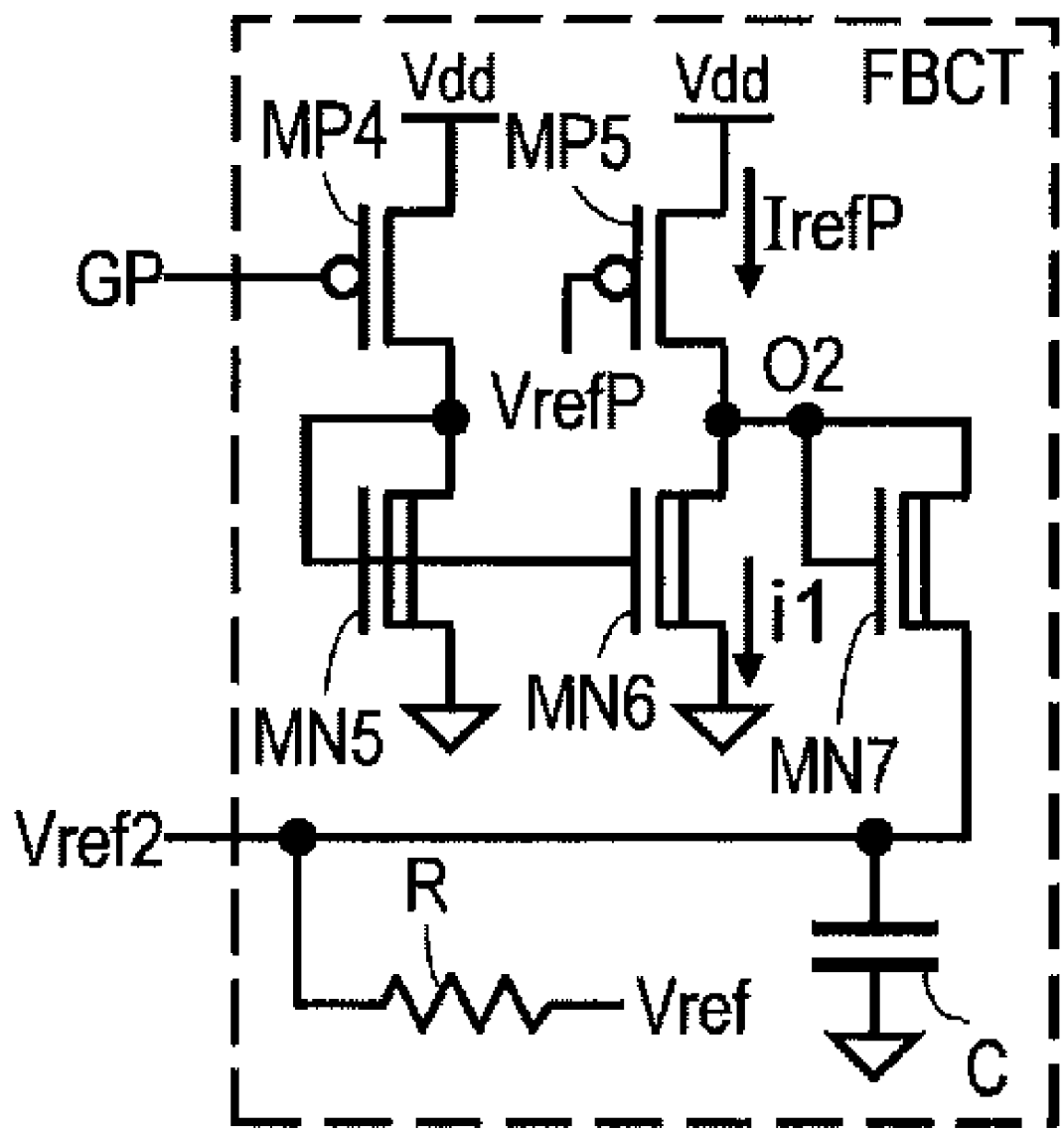
FIG. 5 shows another input stage according to a second illustrated embodiment.

The reference voltage source Vref has a low impedance. The presence of the resistor R enables the voltage Vref2 to be increased under the effect of the current i2. The value of the resistor R influences the feedback loop formed by the circuit FBCT. The higher the value of this resistor, the higher the gain of the feedback loop formed by the circuit FBCT, which tends to increase the risk of appearance of oscillations. FIG. 5 shows another embodiment of a feedback circuit that overcomes this disadvantage. The circuit FBCT comprises, as shown in FIG. 5, a capacitor C enabling the feedback loop to be stabilized. The capacitor C can be inserted between the drain of the transistor MN6 or the source of the transistor MN7 and the ground (FIG. 5).

The current circulating in the input branch (transistors MP2, MN2) is substantially equal to the current i circulating in the reference branch (transistors MP3, MN3) if the input voltage Vin is greater than or equal to the voltage Vref2. The result is that two branches of the differential amplifier tend to impose a maximum current equal to 2i in the transistor MN4. Now, the maximum current that can pass through the transistor MN4 is equal to its saturation current IrefN. Therefore, the current i will be controlled by the feedback circuit FBCT if IrefN>2i, i.e.:

$$i < IrefN/2. \quad (2)$$

In the opposite case, the maximum current would be controlled by the transistor MN4, and equal to IrefN/2, while the circuit FBCT would tend to impose a voltage O2=Vdd, and therefore to saturate the voltage Vref2 to a maximum voltage, close to Vdd−Vtn, without being capable of reaching the value of the current i in the transistor MP3. The condition IrefN>2i also ensures that the transistor MN4 will not be saturated, and therefore that the voltage GND1 will remain sufficiently low for the voltage O1 in the low state to be close to the ground, which is compatible with the use of the inverter I1.

As K.i=IrefP in equilibrium, the condition (2) is equivalent to the following condition:

$$IrefP < (K/2).IrefN. \quad (3)$$

Therefore, the conditions (1) and (3) enable the values to be chosen of IrefP and IrefN to be determined according to the desirable minimum value imin of the current i in the reference branch.

The circuit FBCT that has just been described makes it possible not to impose a high reference voltage Vref, while respecting a sufficient margin of safety on the differential amplifier operation.

It can be advantageous in certain applications to choose a voltage source that supplies a reference voltage Vref lower than or equal to the threshold voltage Vtn, such that the reference voltage Vref2 that is applied to the gate of the transistor MN3 is always adjusted by the circuit FBCT to a minimum value guaranteeing that the differential amplifier DAMP operates correctly.

It will be understood by those skilled in the art that various alternative embodiments and applications of the present invention are possible. Thus, the present invention is not limited to measuring current in the reference branch. Indeed, it is possible to consider measuring the voltage GND1 to detect a correct operation of the differential amplifier. If the voltage GND1 is zero or too close to the ground, the current passing through the reference and input branches is insufficient.

In addition, certain applications may not need a shaped signal at output Vout of the comparator. In this case, the inverters I1, I2, I3 cascade-mounted at the output of the differential amplifier DAMP are not necessary.

Figure 6:
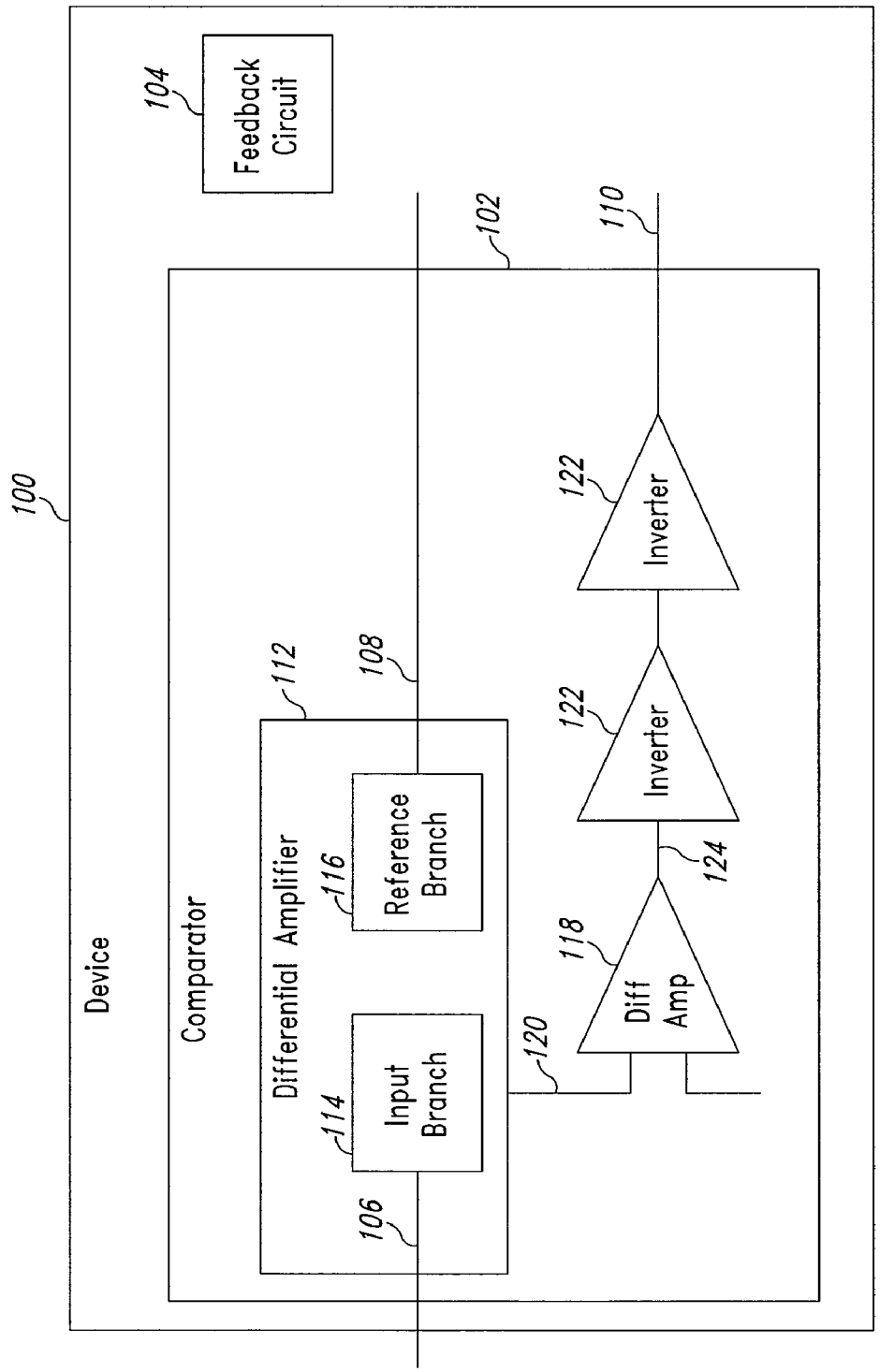
FIG. 6 represents a comparator according to one illustrated embodiment.

FIG. 6 shows a device 100 having a first comparator 102 and a feedback circuit 104. The first comparator 102 compares a voltage of an input signal 106 to the first comparator 102 with a reference voltage 108 and supplies a binary output signal 110 the value of which depends on a result of a comparison of the input signal with the reference voltage. The feedback circuit 104 measures a parameter representative of an operation of the first comparator 102, and raises the reference voltage 108 while the measured parameter reveals a faulty operation of the first comparator 102.

The first comparator 102 includes a first current mirror differential amplifier 112 having an input branch 114 receiving the input signal 106 and a reference branch 116 receiving the reference voltage 108. The first comparator includes a second differential amplifier 118 cascade-connected to an output 120 of the first current mirror amplifier 112, and several inverters 122 cascade-mounted at an output 124 of the second differential amplifier 118, for putting the output signal 120 of the first differential amplifier 112 into the form of a logic signal.

The present invention does not necessarily apply to an integrated circuit. Generally speaking, the present invention can be applied to any device that must detect the presence of voltages that can be low.

The invention claimed is:

1. A device comprising:
    a comparator having an input branch that receives an input signal and a reference branch that receives a reference voltage, the comparator configured to compare a voltage of the input signal received at the input branch of the comparator with the reference voltage received at the reference branch of the comparator, and further configured to supply a binary output signal the value of which depends on a result of a comparison of the input signal with the reference voltage; and
    a feedback circuit measuring a current passing through the reference branch of the comparator, and raising the reference voltage while the measured current reveals a faulty operation of the comparator, wherein the feedback circuit is connected to a first node in the reference branch of the differential amplifier via a first connection and connected to a second node in the reference branch of the differential amplifier via a second connection, the feedback circuit receiving input of the measured current in the reference branch via the first connection and providing the reference potential, via the second connection, to the reference branch.

2. A device according to claim 1, wherein the comparator does not operate correctly if the current measured is below a positive limit value.

3. A device according to claim 1, wherein the feedback circuit comprises:
    a measuring stage supplying a measuring current proportional to the current to be measured;
    a reference voltage source; and
    means for raising the reference voltage when the measuring current is lower than a minimum current.

4. A device according to claim 1, wherein the feedback circuit includes:
    a reference voltage source that has an impedance and that is coupled to the reference branch of the comparator and provides the reference voltage thereto;
    a resistor between the reference voltage source and the reference branch of the comparator that raises the impedance of the reference voltage source and raises the reference voltage under the effect of a current passing through the resistor and that electrically appears when the current measured is lower than a minimum current.

5. A device according to claim 1, wherein the feedback circuit includes:
    a capacitor for absorbing oscillations appearing in the reference voltage.

6. A device according to claim 1, wherein the input branch and the reference branch of the comparator are arranged to include:
   a first current mirror differential amplifier.

7. A device according to claim 6, wherein the comparator comprises several inverters cascade-connected to an output of the differential amplifier for putting the output signal of the differential amplifier into the form of a logic signal.

8. A device according to claim 6, wherein the comparator includes:
   a second differential amplifier cascade-connected to an output of the first amplifier, and several inverters cascade-mounted at an output of the second differential amplifier, for putting the output signal of the first differential amplifier into the form of a logic signal.

9. A device according to claim 1, wherein the device is implemented as an integrated circuit and includes:
   an input stage connected to the input of the comparator.

10. A device according to claim 1 wherein the reference branch of the comparator includes a first terminal for receiving a supply voltage and second terminal, the second terminal of the reference branch connected to a terminal of the input branch of the comparator, wherein the current passing through the reference branch is measured at the node in the reference branch between the first terminal of the reference branch and the second terminal of the reference branch.

11. A device according to claim 1 wherein the feedback circuit includes a branch of a current mirror that mirrors the measured current passing through the reference branch of the comparator.

12. An input stage comprising:
   a differential amplifier having an input branch, a reference branch and an output terminal connected to a node in the input branch, the input branch receiving an input potential, the reference branch receiving a reference potential, the differential amplifier providing at the output terminal an output based upon the input potential and the reference potential; and
   a feedback circuit connected to a first node in the reference branch of the differential amplifier via a first connection and connected to a second node in the reference branch of the differential amplifier via a second connection, the feedback circuit receiving input of an electrical characteristic in the reference branch via the first connection and providing the reference potential, via the second connection, to the second node in the reference branch, wherein the reference potential is based at least upon the electrical characteristic in the reference branch.

13. The input stage of claim 12 wherein the feedback circuit includes:
   a measuring stage connected to at least one of the input branch and the reference branch of the differential amplifier, via the first connection, the measuring stage measuring the electrical characteristic in the differential amplifier and providing an output, which is based upon the measured electrical characteristic; and
   a variable potential stage connected, via the second connection, to the reference branch of the differential amplifier, the variable potential stage receiving the output of the measuring stage and providing the reference potential, via the second connection, to the reference branch of the differential amplifier, the reference potential being based upon the output of the measuring stage.

14. The input stage of claim 13 wherein the variable potential stage increases the reference potential in response to measured electrical characteristic being less than a threshold value.

15. The input stage of claim 14 wherein the electrical characteristic is a current flowing in the reference branch of the differential amplifier.

16. The input stage of claim 12 wherein the feedback circuit is connected to both the input branch and the reference branch.

17. The input stage of claim 12 wherein the first node and the second node in the reference branch are between a first terminal for receiving a supply voltage of the reference branch and a second terminal of the reference branch, the second terminal of the reference branch connected to a terminal of an input branch that is distinct from the output terminal of the differential amplifier.

18. An input stage comprising:
   a differential amplifier having an input branch, a reference branch and an output terminal connected to a first node in the input branch, the input branch receiving an input potential, the reference branch receiving a reference potential, the differential amplifier providing at the output terminal an output based upon the input potential and the reference potential; and
   a feedback circuit connected to a second node of the differential amplifier via a first connection, wherein the second node is connected to at least one of the input branch and the reference branch of the differential amplifier and is different from the first node in the input branch, and connected to the reference branch of the differential amplifier via a second connection, the feedback circuit providing the reference potential, via the second connection, to the reference branch, wherein the reference potential is based upon an electrical characteristic in the differential amplifier; wherein the feedback circuit includes:
   a measuring stage connected to at least one of the input branch and the reference branch of the differential amplifier, via the first connection, the measuring stage measuring the electrical characteristic in the differential amplifier and providing an output, which is based upon the measured electrical characteristic, and
   a variable potential stage connected, via the second connection, to the reference branch of the differential amplifier, the variable potential stage receiving the output of the measuring stage and providing the reference potential, via the second connection, to the reference stage of the differential amplifier, the reference potential being based upon the output of the measuring stage, and wherein the variable potential stage includes:
   a current regulator receiving the output of the measuring stage, the current regulator providing a current based upon the output of the measuring stage; and
   a resistor having a first end connected to the current regulator and the reference branch of the differential amplifier and a second end connected to a reference voltage source.

19. The input stage of claim 18 wherein the variable potential stage includes:
   a capacitor having a first end connected to the current regulator and the first end of the resistor.

20. The input stage of claim 19, wherein the capacitor has a second end being connected to a common reference potential.

21. The input stage of claim 18 wherein the current regulator includes a transistor having a gate, a first conductive region, and a second conductive region, the gate and the first conductive region connected to measuring stage, the second conductive region connected to both the first end of the resistor and the reference branch of the differential amplifier.

22. A device comprising:
a comparator having an input branch that receives an input signal and a reference branch that receives a reference voltage, the comparator configured to compare a voltage of the input signal received at the input branch of the comparator with the reference voltage received at the reference branch of the comparator, and further configured to supply a binary output signal the value of which depends on a result of a comparison of the input signal with the reference voltage; and
a feedback circuit measuring a current passing through the reference branch of the comparator, and raising the reference voltage while the measured current reveals a faulty operation of the comparator, wherein the feedback circuit raises the reference voltage to a raised reference voltage that is at least a threshold voltage while the measured current reveals the faulty operation of the comparator, and wherein the reference branch of the comparator receives the raised reference voltage, and the comparator operates without the faulty condition while the reference branch receives the raised reference voltage, and wherein reference branch of the comparator includes at least one transistor having the measured current passing therethrough, and the faulty operation of the comparator reveals the reference voltage is below a threshold voltage of the transistor, and the feedback circuit raises the reference voltage to a raised reference voltage that is at least a threshold voltage while the measured current reveals the faulty operation of the comparator, and wherein the reference branch of the comparator receives the raised reference voltage, and the comparator operates without the faulty condition while the reference branch receives the raised reference voltage.

23. A device according to claim 22, wherein the feedback circuit comprises:
a measuring stage supplying a measuring current proportional to the current to be measured;
a reference voltage source; and
means for raising the reference voltage when the measuring current is lower than a minimum current.

24. A device according to claim 22 wherein the feedback circuit includes:
a reference voltage source that has an impedance and that is coupled to the reference branch of the comparator and provides the reference voltage thereto;
a resistor between the reference voltage source and the reference branch of the comparator that raises the impedance of the reference voltage source and raises the reference voltage under the effect of a current passing through the resistor and that electrically appears when the current measured is lower than a minimum current.

25. A device according to claim 22 wherein the input branch and the reference branch of the comparator are arranged to include:
a first current mirror differential amplifier.

26. A device according to claim 22 wherein the reference branch of the comparator includes a first terminal for receiving a supply voltage and second terminal, the second terminal of the reference branch connected to a terminal of the input branch of the comparator, wherein the current passing through the reference branch is measured at the node in the reference branch between the first terminal of the reference branch and the second terminal of the reference branch.

27. A device according to claim 22 wherein the feedback circuit is connected to a first node in the reference branch of the differential amplifier via a first connection and connected to a second node in the reference branch of the differential amplifier via a second connection, the feedback circuit receiving input of the measured current in the reference branch via the first connection and providing the reference potential, via the second connection, to the reference branch.

28. A device according to claim 22 wherein the feedback circuit includes a branch of a current mirror that mirrors the measured current passing through the reference branch of the comparator.

29. A device comprising:
a comparator having an input branch that receives an input signal at an input of the input branch and a reference branch that receives a reference voltage at an input of the reference branch, the comparator configured to compare a voltage of the input signal received at the input of the input branch with the reference voltage received at the input of the reference branch, configured to supply from a node in the input branch a binary output signal the value of which depends on a result of a comparison of the input signal with the reference voltage; and
a feedback circuit connected to a first node in reference branch via a first connection and connected to a second node in the reference branch via a second connection and configured to measure a current passing through the reference branch at the first node and configured to raise the reference voltage applied to the second node by an amount of voltage to at least equal a threshold voltage based at least on the measured current passing through the first node in the reference branch corresponding to a faulty operation of the reference branch.

30. The device of claim 29 wherein the feedback circuit comprises:
a branch of a current mirror that mirrors the current passing through the reference branch of the comparator;
a reference voltage source; and
means for raising the reference voltage when the measuring current is lower than a minimum current.

31. The device of claim 29 wherein comparator includes at least one transistor, wherein prior to the reference voltage being raised to at least the threshold voltage, the measured current corresponded to the transistor operating with the faulty operation, and wherein after the reference voltage is raised to at least the threshold voltage, the transistor operates without the faulty operation.

32. The device of claim 29 wherein the reference branch of the comparator includes a first terminal for receiving a supply voltage and second terminal, the second terminal of the reference branch connected to a terminal of the input branch of the comparator, wherein the first node and the second node in the reference branch are between the first terminal and the second terminal of the reference branch, and the first node in the reference branch is between the first terminal and the second node in the reference branch.

* * * * *